United States Patent [19]

Warfield et al.

[11] Patent Number: 5,112,409

[45] Date of Patent: May 12, 1992

[54] SOLAR CELLS WITH REDUCED RECOMBINATION UNDER GRID LINES, AND METHOD OF MANUFACTURING SAME

[75] Inventors: Donald Warfield, Woodbine, Md.; Jerry Silver, East Windsor, N.J.

[73] Assignee: Solarex Corporation, Rockville, Md.

[21] Appl. No.: 646,802

[22] Filed: Jan. 23, 1991

[51] Int. Cl.⁵ .................. H01L 31/06; H01L 31/18
[52] U.S. Cl. .................................. 136/256; 136/255; 136/258; 437/2; 357/30
[58] Field of Search .............. 136/256, 255, 258 AM; 437/2-5; 357/30 J, 30 Q

[56] References Cited

U.S. PATENT DOCUMENTS

| | | | |
|---|---|---|---|
| 4,152,824 | 5/1979 | Gonsiorawaski | 437/2 |
| 4,163,987 | 8/1979 | Kamath et al. | 357/30 |
| 4,207,586 | 6/1980 | Lebailly | 357/52 |
| 4,321,747 | 3/1982 | Takemura et al. | 437/2 |
| 4,400,577 | 8/1983 | Spear | 136/259 |
| 4,434,318 | 2/1984 | Gibbons | 136/258 |
| 4,485,264 | 11/1984 | Izu et al. | 136/246 |
| 4,589,191 | 5/1986 | Green et al. | 437/2 |
| 4,612,409 | 9/1986 | Hamakawa et al. | 136/244 |
| 4,633,034 | 12/1986 | Nath et al. | 136/256 |
| 4,654,468 | 3/1987 | Nath et al. | 136/256 |
| 4,725,558 | 2/1988 | Yamazaki et al. | 437/2 |
| 4,773,942 | 9/1988 | Hamakawa et al. | 136/244 |
| 4,781,766 | 11/1988 | Barnett et al. | 136/258 PC |
| 4,795,500 | 1/1989 | Kishi et al. | 136/244 |
| 4,808,242 | 2/1989 | Murata et al. | 136/244 |
| 4,849,029 | 7/1989 | Delahoy | 136/249 TJ |

Primary Examiner—Aaron Weisstuch
Attorney, Agent, or Firm—Finnegan, Henderson, Farabow, Garrett & Dunner

[57] ABSTRACT

Photovoltaic apparatus includes a passivating oxide layer formed directly on the surface of a first conductivity type amorphous silicon material in a pattern corresponding substantially to a preselected metalized wide grid layer pattern. The patterned oxide layer is used as a mask to form a diffused layer of opposite conductivity type amorphous silicon material on those surface portions not covered by the oxide layer. The metalized grid layer is then formed on the oxide layer, covering the oxide layer, and overlapping the diffused opposite conductivity type layer at the edges to form continuous or intermittent ohmic contact areas with the diffused layer along the oxide layer-diffused layer boundaries.

16 Claims, 2 Drawing Sheets

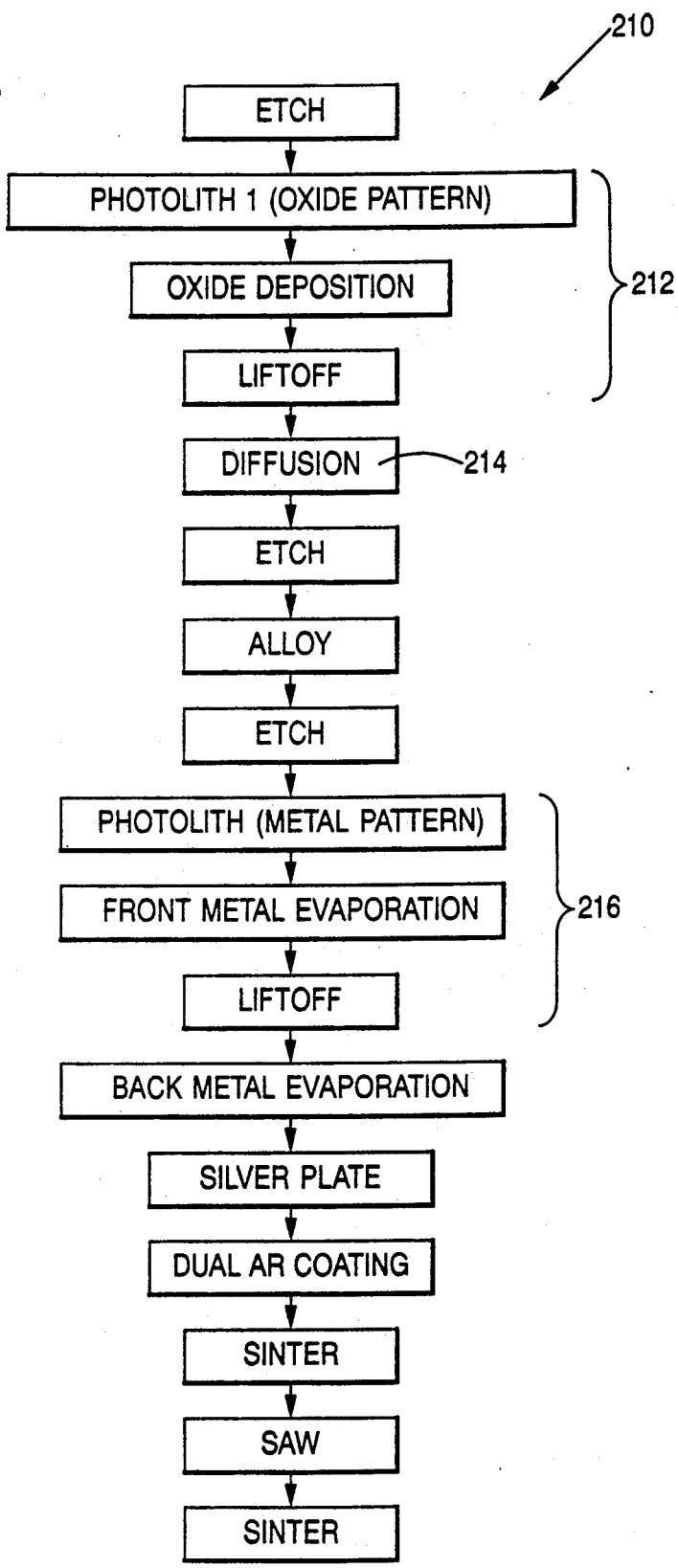

SOLAR CELLS WITH REDUCED RECOMBINATION UNDER GRID LINES, AND METHOD OF MANUFACTURING SAME

BACKGROUND OF THE INVENTION

1. Field of the Invention

The present invention relates to solar cells and other photovoltaic devices formed by the junction of two photovoltaic materials of different semiconductor conductivity type with an overlying metalized grid layer, and processes for making such photovoltaic devices and apparatus. The present invention relates particularly to a photovoltaic apparatus utilizing relatively wide conductor grids or grid lines on the surface of the device intended to be exposed to radiant energy, such as sunlight.

2. Description of the Prior Art

Photovoltaic devices such as solar cells utilizing layered junctions of semiconductor materials, such as crystalline silicon, are known in the art, and examples are shown in Gibbons U.S. Pat. No. 4,434,318 and Delahoy U.S. Pat. No. 4,849,029. A figure of merit commonly associated with such photovoltaic devices is the efficiency of converting the incident radiant energy into electrical energy. In turn, the efficiency is directly related to the open circuit voltage achievable with the device together with the "fill factor," as would be understood by those skilled in the art.

The prior art has recognized problems with conventional solar cells caused by the high surface recombination velocity of the photovoltaic materials. This phenomenon can degrade the open circuit voltage and fill factor of the photovoltaic device.

Various solutions to this problem have been proposed, including the construction shown in U.S. Pat. No. 4,589,191 to Green et al. In the Green et al. device, a thick passivating oxide layer is formed between the upper photovoltaic layer (relative to the incident radiant energy) and the overlying metalized grid layer. Small discrete apertures or openings are formed in the oxide layer to provide direct contact between the metalized grid layer and the upper photovoltaic material layer. Also, the thickness of the passivating oxide layer is controlled to provide indirect conductivity between the upper photovoltaic material layer and the metalized grid layer via the "tunneling" phenomena.

While constituting improvements over the other state of the art photovoltaic devices, these structures require relatively complicated process steps and controls and result in devices with "shadowed" junctions, that is, semiconductor junctions existing under the metalized grid layer which, although shadowed from at least a portion of the incident radiant energy, can nevertheless act as recombination sites. These "shadowed" junctions can lead to a deterioration in the performance for photovoltaic apparatus constructions utilizing relatively wide grid lines, such as cells designed for use with a prismatic cover.

SUMMARY OF THE INVENTION

Hence, an object of the present invention is to achieve a photovoltaic apparatus wherein the benefits of increased open circuit voltage and fill factor can be achieved while maintaining the current carrying advantages of relatively wide, large area grid lines.

It is also an object of the present invention to achieve the aforesaid object with a relatively simplified manufacturing method so as to increase the cost effectiveness of the photovoltaic apparatus utilizing junctions of photovoltaic materials of different conductivity types in conjunction with a relatively large area metalized grid layer.

In accordance with the present invention as embodied and broadly described herein, the photovoltaic apparatus for converting incident radiant energy to electrical energy comprises a first or base photovoltaic material layer of one conductivity type and having a surface, and an insulative material layer formed directly on the first layer surface in a pattern corresponding substantially to a preselected grid pattern and having a surface spaced from the first layer surface. A second or upper photovoltaic material layer of the opposite conductivity type is formed on those portions of the first layer surface not covered by the patterned insulative material layer, the adjacent edge portions of the insulative and second layers defining boundaries therebetween. The apparatus further includes a metalized grid layer formed directly on the insulative layer surface in the preselected grid pattern, with the grid layer covering the insulative layer and overlapping at least a portion of the second layer for electrically contacting the second layer along the defined boundaries.

In one preferred embodiment the contact between the grid layer and the second photovoltaic material layer is substantially continuous along the defined boundaries. Alternatively it is preferred that the contact between the grid layer and the second photovoltaic material layer is regularly intermittent along the defined boundaries.

It is also preferred that the first and second photovoltaic material layers are crystalline silicon layers; that the insulative layer is a silicon oxide layer; and that the second photovoltaic material layer is a diffused layer.

Further, in accordance with the present invention as embodied and broadly described herein, the method of making photovoltaic apparatus of the type having a photovoltaic material material base layer of the other conductivity type and a metalized grid layer in a preselected pattern in contact with the photovoltaic material of the one conductivity type comprises the steps of forming an insulative layer directly on the base surface in a first pattern corresponding substantially to the preselected pattern; forming a layer of the photovoltaic material of the one conductivity type on the portions of the base surface not covered by the first patterned insulative layer; and forming the patterned metalized grid layer directly on the first patterned insulative layer. The metalized grid forming step includes the steps of covering the first patterned insulative layer and overlapping at least a portion of the photovoltaic material layer of the one conductivity type for electrically contacting the photovoltaic material layer of the one conductivity type along the boundaries between adjacent edge portions of the insulative layer and the one conductivity type material layer.

The accompanying drawing, which is intended to be part of the present description and is to be read in conjunction with the description of the preferred embodiments set forth hereinafter, will enable the invention to be more fully understood.

BRIEF DESCRIPTION OF THE DRAWING

In the drawing:

FIG. 3 is a flow chart showing schematically one embodiment of the method for making photovoltaic apparatus in accordance with the present invention.

DESCRIPTION OF THE PREFERRED EMBODIMENTS

Figure 1:
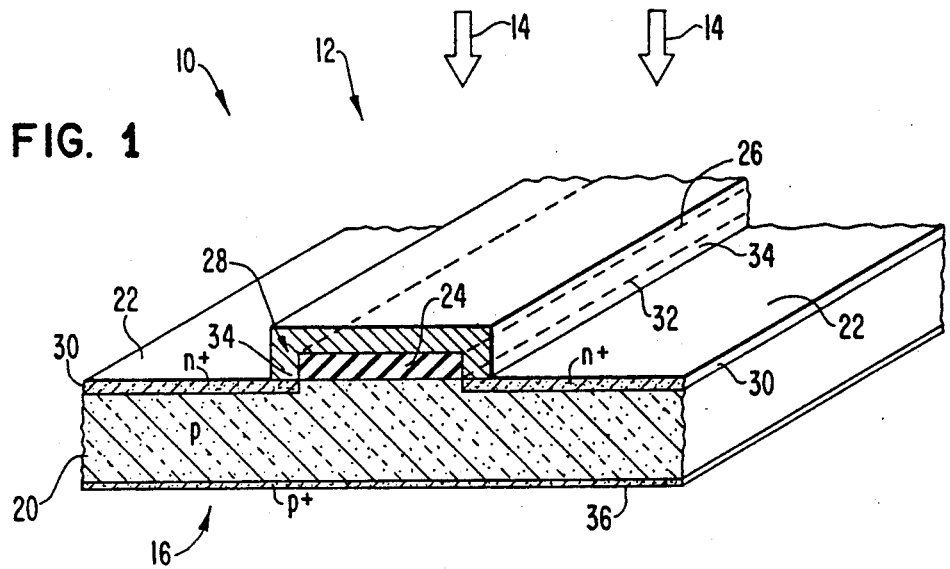
FIG. 1 is a schematic cross-sectional plan view of one embodiment of photovoltaic apparatus made in accordance with the present invention.

With initial reference to FIG. 1, there is shown a first embodiment of photovoltaic apparatus made in accordance with the present invention and designated generally by the numeral 10. Photovoltaic apparatus 10 includes a generally planar upper surface 12 intended to be illuminated with incident radiant energy (designated by arrows 14) and to convert the radiant energy to electrical energy, in a manner well understood by those skilled in the art. Photovoltaic apparatus 10 also includes a bottom surface 16 which can be conveniently mounted to a structural support member and/or a conductor element (both not shown). Photovoltaic apparatus 10 is shown as a generally planar, rectangular body, but the present invention is not limited to such a configuration. Rather, one skilled in the art would understand that the actual geometric configuration can be tailored to a specific application.

In accordance with the present invention, the photovoltaic apparatus includes a first or base photovoltaic material layer of one conductivity type. As embodied herein with continued reference to FIG. 1, photovoltaic apparatus 10 includes layer 20 of a photovoltaic material such as crystalline silicon which has been doped to provide a "P" type of semiconductor conductivity. While the preferred material for the first photovoltaic material layer is crystalline silicon, the present invention is not limited to this particular material but can include such materials as amorphous silicon, or GaAs which can be made to exhibit a "P" conductivity or the opposite, "N" type of semiconductor conductivity. Also, a doped silicon material can be used for first layer 20 to provide an "N" type conductivity, as one skilled in the art would realize. First photovoltaic material layer 20 includes upper surface 22 facing the direction of the radiant energy incident on photovoltaic apparatus 10 and has a thickness sufficient to maintain structural integrity and support the overlaying layers to be discussed henceforth.

Further in accordance with the present invention, the photovoltaic apparatus includes an insulative material layer formed directly on the first layer in a pattern corresponding substantially to a desired, preselected metalized grid pattern. The insulative material layer also has an upper surface spaced from the first layer upper surface. As embodied herein and with continued reference to FIG. 1, photovoltaic apparatus 10 includes insulative layer 24 formed directly on surface 22 of first layer 20. Insulative layer 24 includes upper surface 26 spaced from surface 22 by the thickness of insulative layer 24.

Preferably, insulative layer 24 is an oxide layer such as a passivating silicon oxide layer which can be conveniently formed by oxidation of the underlying first layer 20 when the first layer is a silicon layer. However, other insulative materials, including oxides and nitrides of materials different from the material used for the first layer 20, can be used in the photovoltaic apparatus according to the present invention. Importantly, insulative layer 24 is formed to correspond substantially to the grid pattern of the overlying metalized grid conductor layer, such as layer 28 in the FIG. 1 embodiment, for reasons to be explained in more detail hereinafter.

Still further in accordance with the present invention, a second photovoltaic material layer of the opposite conductivity type relative to the first layer is formed on those portions of the first layer upper surface not covered by the patterned insulative layer. The adjacent edge portions of the insulative and second layers in effect define boundaries between these layers. As embodied herein and with continued reference to FIG. 1, second photovoltaic material layer 30 is formed on those portions of upper surface 22 of first layer 20 not occupied by insulative layer 24. In the FIG. 1 embodiment, second layer 30 is formed by a diffusion process wherein the silicon material is converted to "N plus" type silicon material by the introduction of suitable dopant elements such as Arsenic, Phosphorus, etc.

Although the formation of second layer 30 by a diffusion process is highly preferred because of the relative ease of fabrication and inherent compatibility with the material of first layer 20, other materials can be used for second layer 30 and can be applied using other fabrication techniques such as ion implantation. As shown schematically by dotted lines 32 in the FIG. 1 schematic, the adjacent edges of insulative layer 24 and second photovoltaic material layer 30 form boundaries between the respective layers.

Still further in accordance with the present invention, a metalized grid layer is formed directly on the insulative layer upper surface in the desired, preselected grid pattern. Importantly, the grid layer both covers the insulative layer and overlaps at least a portion of the second photovoltaic material layer for the purpose of electrically contacting that layer along the defined boundaries. As embodied herein, and with continued reference to FIG. 1, metalized grid layer 28 is formed on surface 26 of insulative layer 24. The metalized grid layer 28 covers insulative layer 24 and extends in the transverse direction to overlap the edge portions of second photovoltaic material layer 30 to establish direct, ohmic contact with second layer 30 along the boundaries 32.

In the FIG. 1 embodiment, the areas of overlap, and thus electrical contact, between metalized grid layer 28 and second layer 30 are in the shape of narrow strips of substantially constant width running essentially continuously along the , boundaries 32 between insulative layer 24 and second layer 30. By controlling the extent of the overlap, that is, the width of the contact areas 34, the total amount of contact between the metalized grid layer 28 and second layer 30 can be controlled. Concurrently, the insulative layer 24 reduces substantially the and second layer 30 for a given grid line width.

Hence, the benefit of increased current carrying capacity available from an increased grid conductor width of constant thickness can be achieved without the disadvantage of reduced open circuit voltage and fill factor accompanying a large contact area between the grid conductor layer 28 and second layer 30 of photovoltaic material. This is a consequence of the insulating layer 24 such as an oxide layer formed directly on the first or base layer 20 which prevents entirely the formation of a semiconductor junction directly under most of grid layer 28. This is a significant benefit for photovoltaic apparatus constructions with relatively wide grid elements, especially apparatus with high diode reverse saturation currents.

Figure 2:
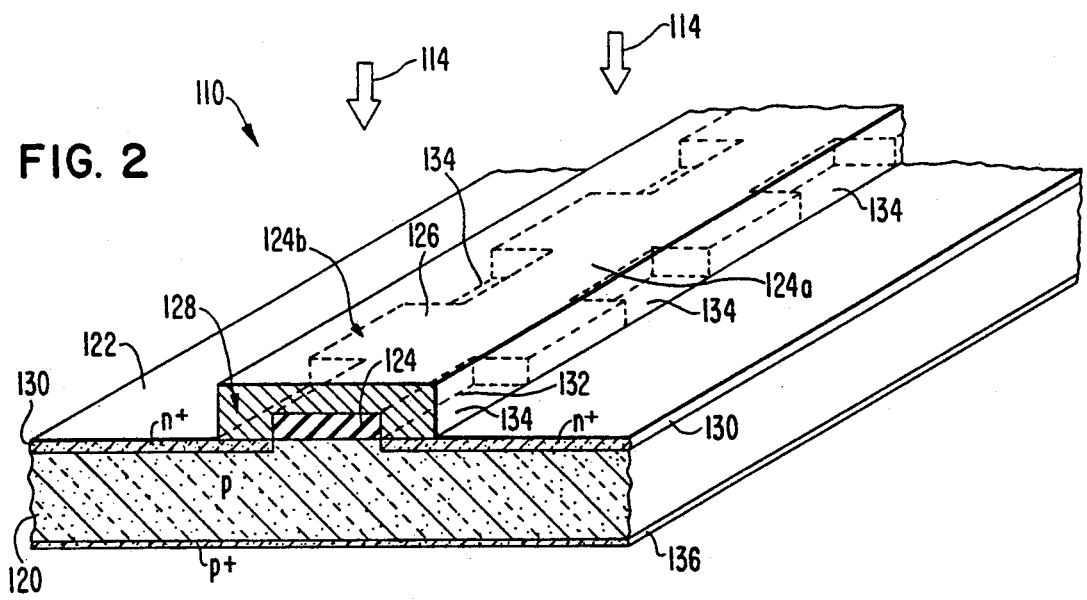
FIG. 2 is a schematic cross-sectional plan view of another embodiment of photovoltaic apparatus made in accordance with the present invention.

As one skilled in the art would realize, the embodiment of FIG. 1 depends upon close control of the size and registration of insulating layer 24 and overlapping metal grid layer 28 to achieve the desired contact area 34 widths on opposing sides of the insulating layer 24. An alternative embodiment of the present invention in which the necessity of close tolerance control and registration between the insulating layer and the overlapping metal grid layer is relaxed somewhat is shown in FIG. 2 and designated generally by the numeral 110. In the FIG. 2 embodiment, the like elements relative to the FIG. 1 embodiment are given the same number but with the prefix 100 added thereto for the convenience of the reader.

In the FIG. 2 embodiment, the base or first photovoltaic material layer 120 has an upper surface 122, relative to the direction of illumination by incident radiation 114. However, in place of the elongated rectangular insulative layer element 24 having an essentially constant transverse width as depicted in the FIG. 1 embodiment, insulative layer 124 of the FIG. 2 embodiment is made up of a series of alternating rectangular segments of different widths including narrower rectangular segments 124a and wider rectangular segments 124b. As in the FIG. 1 embodiment, second photovoltaic material layer 130 is formed on base layer upper surface 122 in all areas not occupied by insulative layer 124. The resulting boundaries 132 between adjacent edges of insulating layer 124 and second photovoltaic 1 material layer 130 are staggered lines each resembling a square wave output if viewed in the direction of the incident radiant energy.

Importantly, the transverse width of metalized grid layer 128 of the FIG. 2 embodiment which is formed on the upper surface 126 of insulative layer 124 is essentially constant and sized to overlap second photovoltaic material layer 130 only in the regions of those segments of the insulative layer 124 having the narrow widths. There results a series of pad-like ohmic contact areas 134 spaced along the boundaries 132 providing spatially intermittent or discontinuous contact between the metalized grid layer 128 and the upper photovoltaic material layer 130. The FIG. 2 embodiment thus has the potential for achieving a smaller total contact area for a given alignment tolerance between metalized grid layer 128 and patterned insulative layer 124 while ensuring positive electrical contact areas on both transverse sides of each insulative layer element.

One skilled in the art would realize from the above discussion in conjunction with the FIG. 2 schematic that other patterns for the insulative layer 124 could be utilized to provide the benefits and advantages discussed previously. Thus, the longitudinal lengths of the larger and smaller rectangular insulative layer segments need not be the same nor is it necessary to have an insulative layer yielding a square wave-type boundary, as opposed to a saw-tooth or other boundary shape. Also, the grid pattern, and thus the underlying insulative layer pattern, need not be aligned rectangularly with the edges of the photovoltaic devices but can be angled. A solar cell has been constructed in accordance with the FIG. 2 embodiment having a generally square geometry but with the grid lines running on the diagonal.

With reference again to FIG. 1, photovoltaic apparatus 10 also can include a further layer 36 formed on the bottom side 16 of the apparatus for providing a back surface field, as would be understood by one skilled in the art. Preferably, layer 36 is a diffused layer, and in the FIG. 1 embodiment, has a P+ semiconductor conductivity, with the "+" denoting a higher concentration of P-dopant materials relative to first layer 20. A similar layer, layer 136, is provided in the FIG. 2 embodiment.

The method of making the photovoltaic apparatus of the present invention utilizes many of the conventional process steps for fabricating high precision photovoltaic devices. A currently preferred sequence of steps is depicted schematically as 210 in FIG. 3 and begins with a conventional etching process using NaOH for preparing the surface of the base or first photovoltaic material layer. In accordance with the present invention, and as distinguished from the manufacture of conventional photovoltaic apparatus, the method next includes the step of forming an insulative layer directly on the upper surface of the base photovoltaic material layer in a pattern corresponding substantially to the desired, preselected grid pattern. As embodied in the FIG. 3 method, insulative material layer forming step 212 includes the substeps of forming a photoresist film on the base surface in the desired oxide pattern, forming the oxide by deposition or thermal oxidation, and then lifting off the photoresist mask. A suitable mask is that made by Advance Reproductions.

Further in accordance with the method of the present invention, a second layer of photovoltaic material is formed on the portions of the base or first photovoltaic material layer upper surface not covered by the patterned insulative layer. As discussed previously, the second photovoltaic material layer is of a conductivity type opposite to that of the first or base layer. As embodied herein, and with continued reference to FIG. 3, the upper photovoltaic material layer is formed by converting the portions of the base layer not covered by the insulative layer to the opposite conductivity type using diffusion step 214. For the case of a crystalline silicon base layer having P conductivity, such a diffusion step can include diffusing an N-dopant such as Phosphorus or Arsenic into the exposed surface of the base photovoltaic material layer to convert the diffused layer to the "N plus" conductivity type. If the insulative layer is of the type such as silicon oxide, the insulative layer itself can function as a mask for the diffusion process used to form the second layer. Following the diffusion step 214, a further etching step is performed to remove oxide generated in the diffusing step; an alloying step is carried out to provide the back surface field generating layer; and a subsequent etching step for surface preparation is carried out on the photovoltaic device preform.

Further in accordance with the method of the present invention, a patterned metalized grid layer is formed directly on the insulative layer to be in contact with the upper photovoltaic material layer along the defined boundaries between the upper photovoltaic material and insulative layer. As embodied herein, the metalized grid layer forming step designated generally as 216 in the FIG. 3 schematic includes the substeps of applying a photoresist mask corresponding to the desired metalized grid layer pattern, depositing metal on the insulative layer and upper photovoltaic material layer through the mask such as by a metal evaporation process, and lifting off the photoresist mask. As discussed previously, to form the photovoltaic apparatus shown in the FIG. 1 embodiment, the photoresist mask includes a patterned metalized grid layer which covers the patterned insulative layer and overlaps the second layer along the defined boundaries to provide essentially continuous contact between the metalized grid layer and second photovoltaic material layer along the boundaries characterizing apparatus such as shown in FIG. 1. The term "essentially continuous contact" is intended to allow for random, minor discontinuities where, due to dust or other imperfections, no direct ohmic contact is established in relatively few, highly localized areas along the boundaries.

As also will be appreciated by one skilled in the art, the photoresist masks for the insulative layer and the metalized grid layer can also be configured to form constructions such as depicted in the FIG. 2 embodiment wherein the electrical contacts between the metalized grid layer and the second photovoltaic material layer are a series of discontinuous contact areas or "pads" extending along the defined boundaries. Also, combinations of the contact configuration as shown in the FIG. 1 embodiment and that shown in the FIG. 2 embodiment could be utilized for particular applications.

The remaining steps in the method depicted schematically by the flow chart of FIG. 3 are conventional, including a back metal evaporation step to establish the foundation for the other conductor element, a silver plating step to build up the thickness of the metal conductors, a dual anti-reflection coating, and a sintering step to stabilize the various layers. Inasmuch as the photovoltaic devices of the present invention typically are made in sheet form containing many individual units, the further steps of sawing to separate the individual units and final sintering to remove any residual stresses from the sawing are typically carried out.

Although the invention has been described above with reference to the drawing and to preferred embodiments, it will be appreciated that numerous variations, modifications or alternatives may be substituted for specifically described features, without departing from the spirit or scope of the invention as broadly described above. Such variations, modifications and alternatives are intended to come within the scope of the present invention as defined by the following claims and their equivalents.

What is claimed is:

1. Photovoltaic apparatus for converting incident radiant energy to electrical energy comprising:
   a first photovoltaic material layer of one conductivity type and having a surface;
   an insulative material layer formed directly on said first layer surface in a pattern corresponding substantially to a preselected grid pattern and having a surface spaced from said first layer surface;
   a second photovoltaic material layer of the opposite conductivity type formed on those portions of said first layer surface not covered by said patterned insulative layer, adjacent portions of said insulative and second layers defining boundaries therebetween; and
   a metalized grid layer formed directly on said insulative layer surface in said preselected grid pattern, said grid layer covering said insulative layer and overlapping at least a portion of said second layer for electrically contacting said second layer along said defined boundaries, the radiant energy being incident on said second layer and said grid layer.

2. The apparatus as in claim 1 wherein the contact between said grid layer and said second layer is substantially continuous along said defined boundaries.

3. The apparatus as in claim 1 wherein the contact between said grid layer and said second layer is intermittent along said defined boundaries.

4. The apparatus as in claim 1 wherein said first and second layers are amorphous silicon layers.

5. The apparatus as in claim 1 wherein said insulative layer is an oxide layer.

6. The apparatus as in claim 1 wherein said second layer is a diffused layer.

7. Photovoltaic apparatus for converting incident radiant energy to electrical energy comprising:
   a first photovoltaic material layer of one conductivity type and having a surface;
   an insulative material layer formed directly on said first layer surface in a pattern corresponding substantially to a preselected grid pattern and having a surface spaced from said first layer surface;
   a second photovoltaic material layer of the opposite conductivity type formed on those portions of said first layer surface not covered by said patterned insulative layer, adjacent portions of said insulative and second layers defining boundaries therebetween; and
   a metalized grid layer formed directly on said insulative layer surface in said preselected grid pattern, said grid layer covering said insulative layer and overlapping at least a portion of said second layer for electrically contacting said second layer along said defined boundaries, wherein said first and second layers are crystalline silicon layers, said insulative layer is a silicon dioxide layer, and said second layer is a diffused layer, the radiant energy being incident on said second layer and said grid layer.

8. The apparatus as in claim 7 wherein the contacts between said grid layer and said second layer are narrow strips of substantially constant transverse width extending substantially continuously along said boundaries.

9. The apparatus as in claim 7 wherein the contacts between said grid layer and said second layer are intermittent along said boundaries.

10. The apparatus as in claim 9 wherein said intermittent contacts include a plurality of substantially rectangular areas regularly spaced along said defined boundaries.

11. A method of making photovoltaic apparatus of the type having a photovoltaic material of one conductivity type layered on a surface of a photovoltaic material base layer of the other conductivity type and a metalized grid layer in a preselected pattern in contact with the photovoltaic material of the one conductivity type, the one conductivity type material layer and grid layer being exposable to the radiant energy to be converted, the method comprising the steps of:
   forming an insulative layer directly on the base layer surface in a first pattern corresponding substantially to the preselected pattern;
   forming the photovoltaic material layer of the one conductivity type on the portions of the base layer surface not covered by the first patterned insulative layer, wherein boundaries between adjacent portions of the insulative layer and the photovoltaic material layer are defined; and
   forming the patterned metalized grid layer directly on the insulative layer, said metalized grid forming step including the steps of covering the insulative layer and overlapping at least portion of the one conductivity type layer for electrically contacting the metalized grid layer and the one conductivity type photovoltaic material layer along the defined boundaries.

12. The method as in claim 11 wherein said metalized grid layer forming step includes overlapping the one conductivity type layer to provide substantially continuous electrically contact along the defined boundaries.

13. The method as in claim 11 wherein said metalized grid layer forming step includes intermittently overlapping the one conductivity type layer to provide intermittent contact along the defined boundaries.

14. The method as in claim 11 wherein said one conductivity type photovoltaic material layer forming step includes a diffusing substep.

15. The method as in claim 11 wherein said insulative layer forming step includes an oxidizing substep.

16. The method as in claim 11 wherein the first patterned insulative layer is used as a mask for the one conductivity type photovoltaic material layer forming step.

* * * * *